United States Patent
Kouassi et al.

(10) Patent No.: US 10,522,393 B2
(45) Date of Patent: Dec. 31, 2019

(54) DEVICES AND METHODS OF FORMING THEREOF BY POST SINGLE LAYER TRANSFER FABRICATION OF DEVICE ISOLATION STRUCTURES

(71) Applicant: GLOBALFOUNDRIES Singapore Pte. Ltd., Singapore (SG)

(72) Inventors: Kouassi Sebastien Kouassi, Singapore (SG); Raj Verma Purakh, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/874,853

(22) Filed: Jan. 18, 2018

(65) Prior Publication Data

US 2019/0221472 A1 Jul. 18, 2019

(51) Int. Cl.
    H01L 21/76 (2006.01)
    H01L 21/768 (2006.01)
    H01L 29/06 (2006.01)
    H01L 21/762 (2006.01)

(52) U.S. Cl.
    CPC .. H01L 21/76802 (2013.01); H01L 21/76224 (2013.01); H01L 29/0649 (2013.01)

(58) Field of Classification Search
    CPC .................................................... H01L 31/18
    See application file for complete search history.

(56) References Cited

U.S. PATENT DOCUMENTS

| 10,043,841 B1* | 8/2018 | Chang | H01L 27/1463 |
| 2014/0016012 A1* | 1/2014 | Oishi | H04N 5/372 348/311 |
| 2015/0061062 A1* | 3/2015 | Lin | H01L 27/14643 257/432 |

(Continued)

FOREIGN PATENT DOCUMENTS

TW 201304104 A 1/2013

OTHER PUBLICATIONS

L.P.Allen et al., SOI Uniformity and Surface Smoothness Improvement Using GCIB Processing, 2002 International SOI Conference, Oct. 2002, pp. 192-193, IEEE, USA.

(Continued)

*Primary Examiner* — Caridad Everhart
*Assistant Examiner* — Ankush K Singal
(74) *Attorney, Agent, or Firm* — Thompson Hine LLP; Anthony Canale

(57) ABSTRACT

Semiconductor devices and methods of forming thereof by post layer transfer fabrication of device isolation structures are described. A substrate with first and second major surfaces is provided. Circuit components may be formed on the first major surface of the substrate and a back-end-of-line (BEOL) dielectric layer is formed over the first major surface of the substrate which covers the circuit components. A single layer transfer is performed to expose the second major surface of the substrate for processing. The second major surface of the semiconductor substrate is processed to thin down the wafer, followed by a wafer thickness uniformity improvement process. One or more device isolation structures are formed through the semiconductor substrate from the second major surface of the semiconductor substrate.

15 Claims, 15 Drawing Sheets

(56) References Cited

U.S. PATENT DOCUMENTS

2016/0141228 A1* 5/2016 Leobandung ......... H01L 23/481
257/621
2017/0358562 A1* 12/2017 Banna ................... H01L 25/167

OTHER PUBLICATIONS

Taiwan Intellectual Property Office, Examination Report and English translation thereof issued in Taiwanese Patent Application No. 107113042 dated Jun. 4, 2019.

* cited by examiner

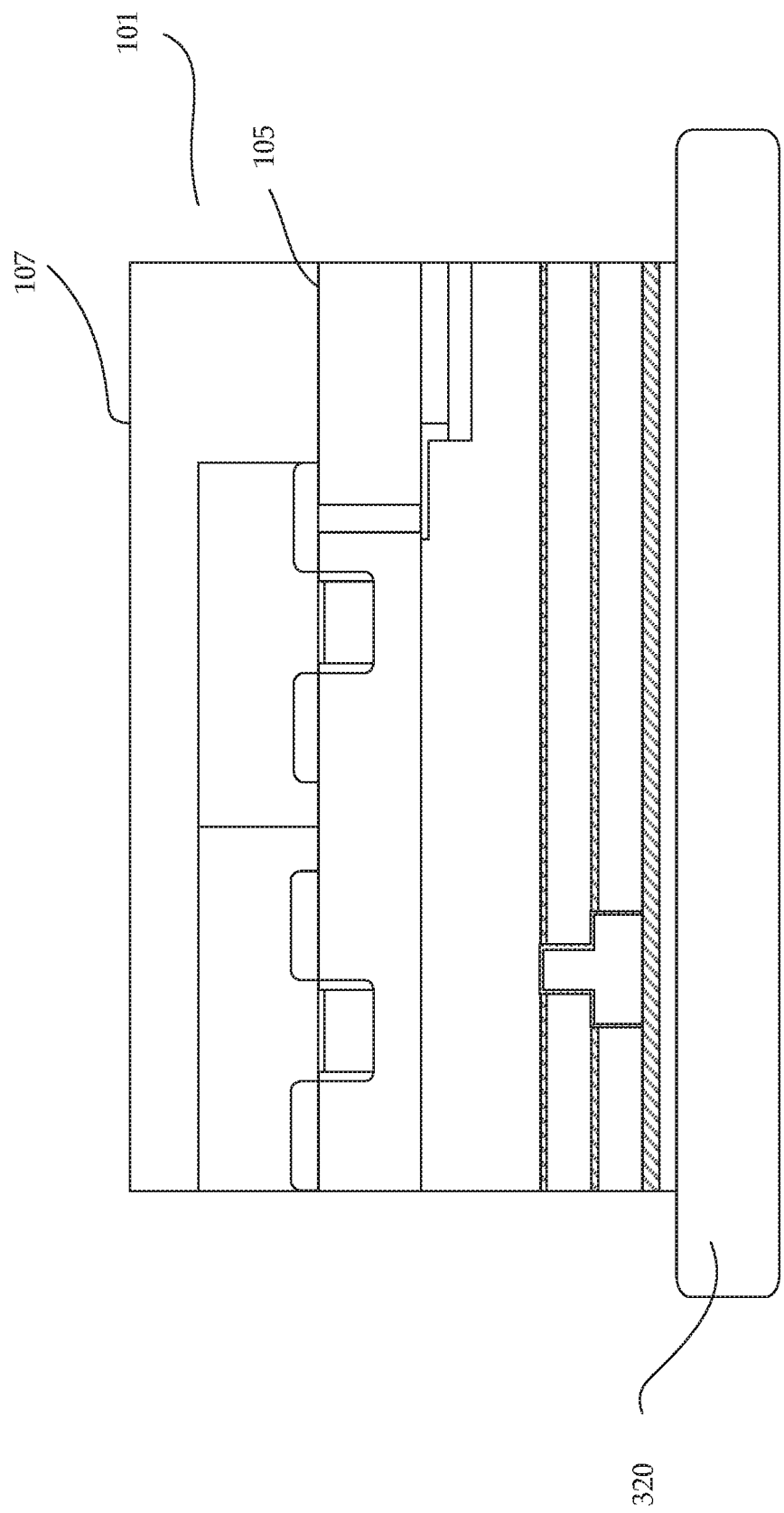

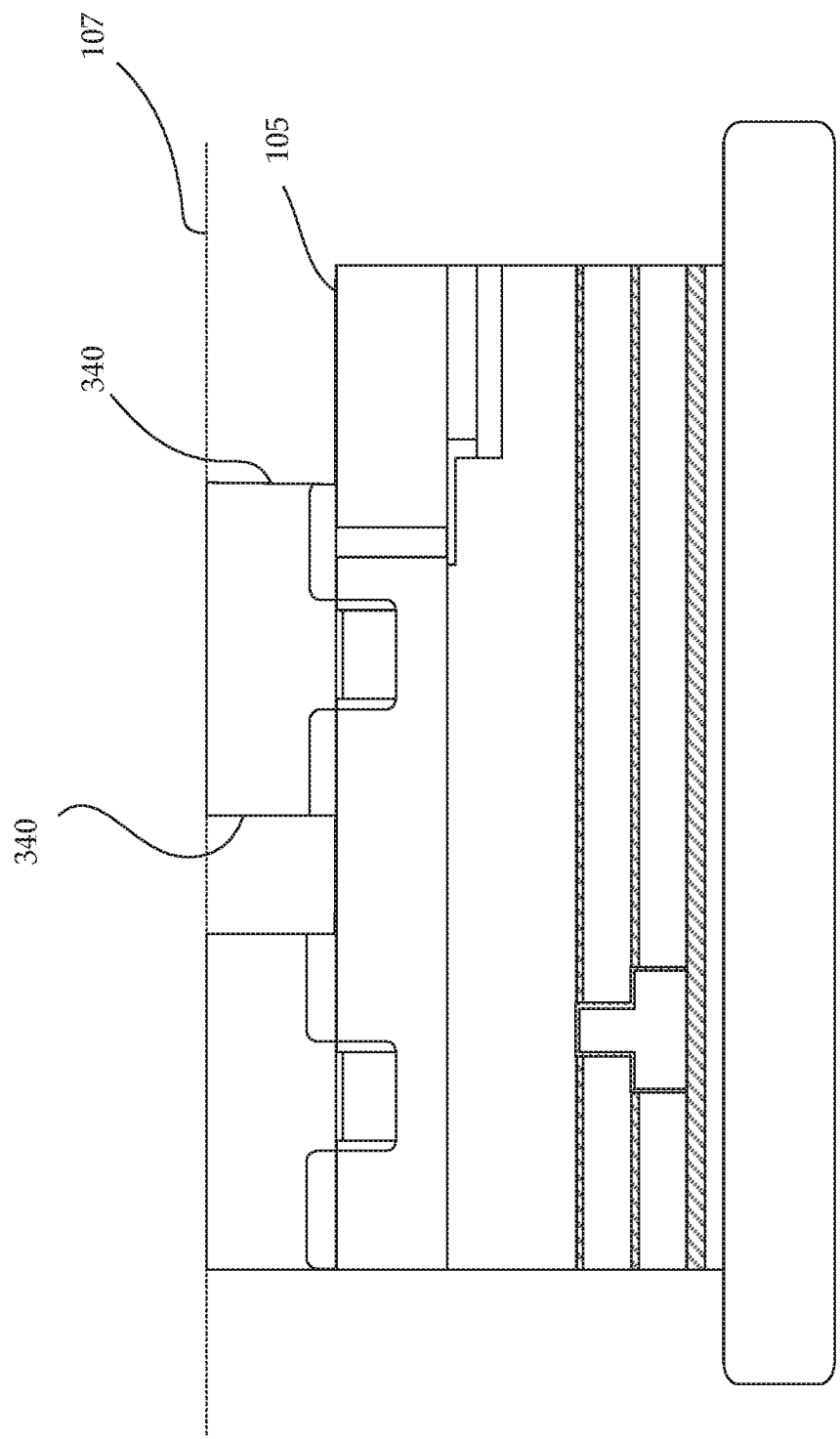

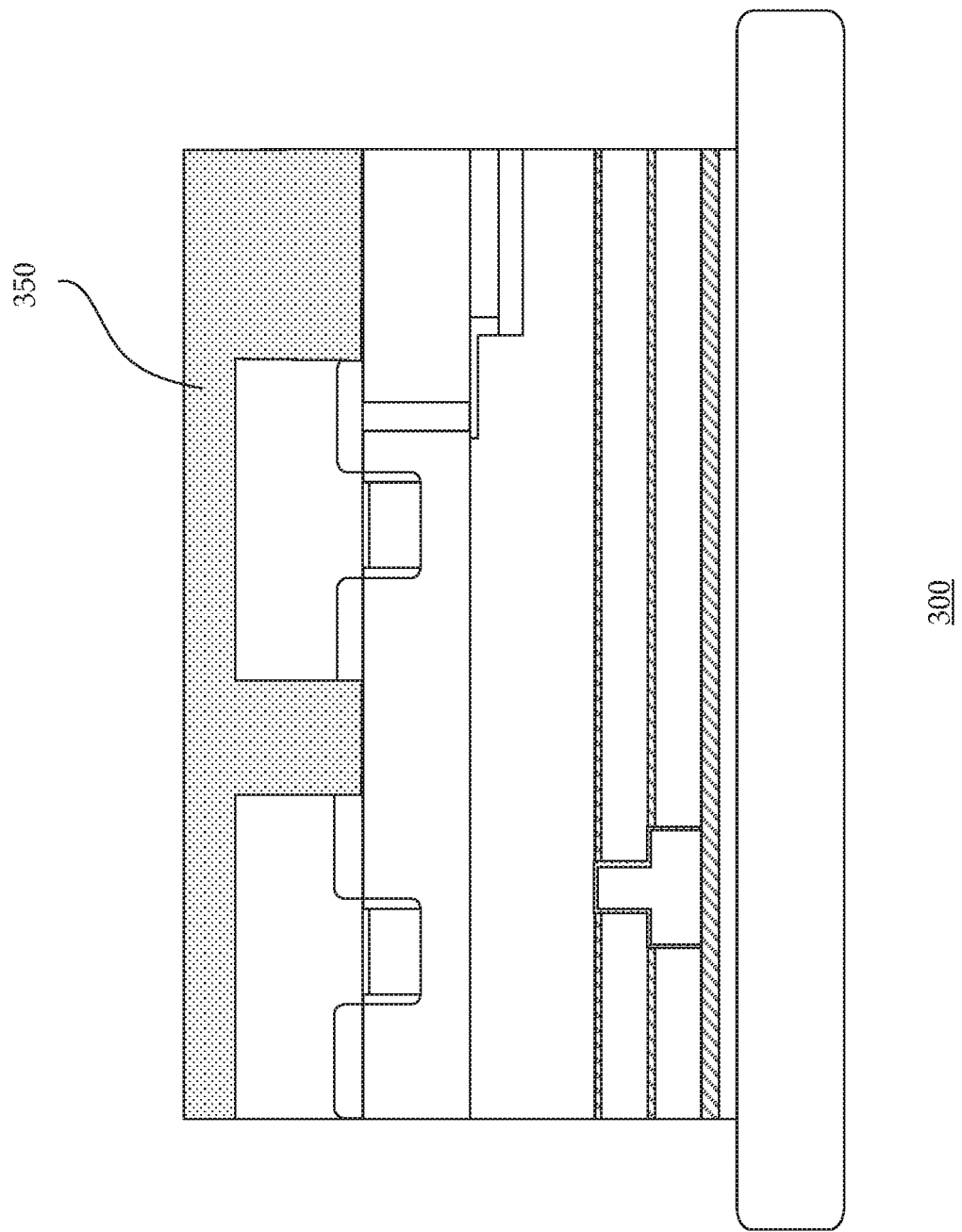

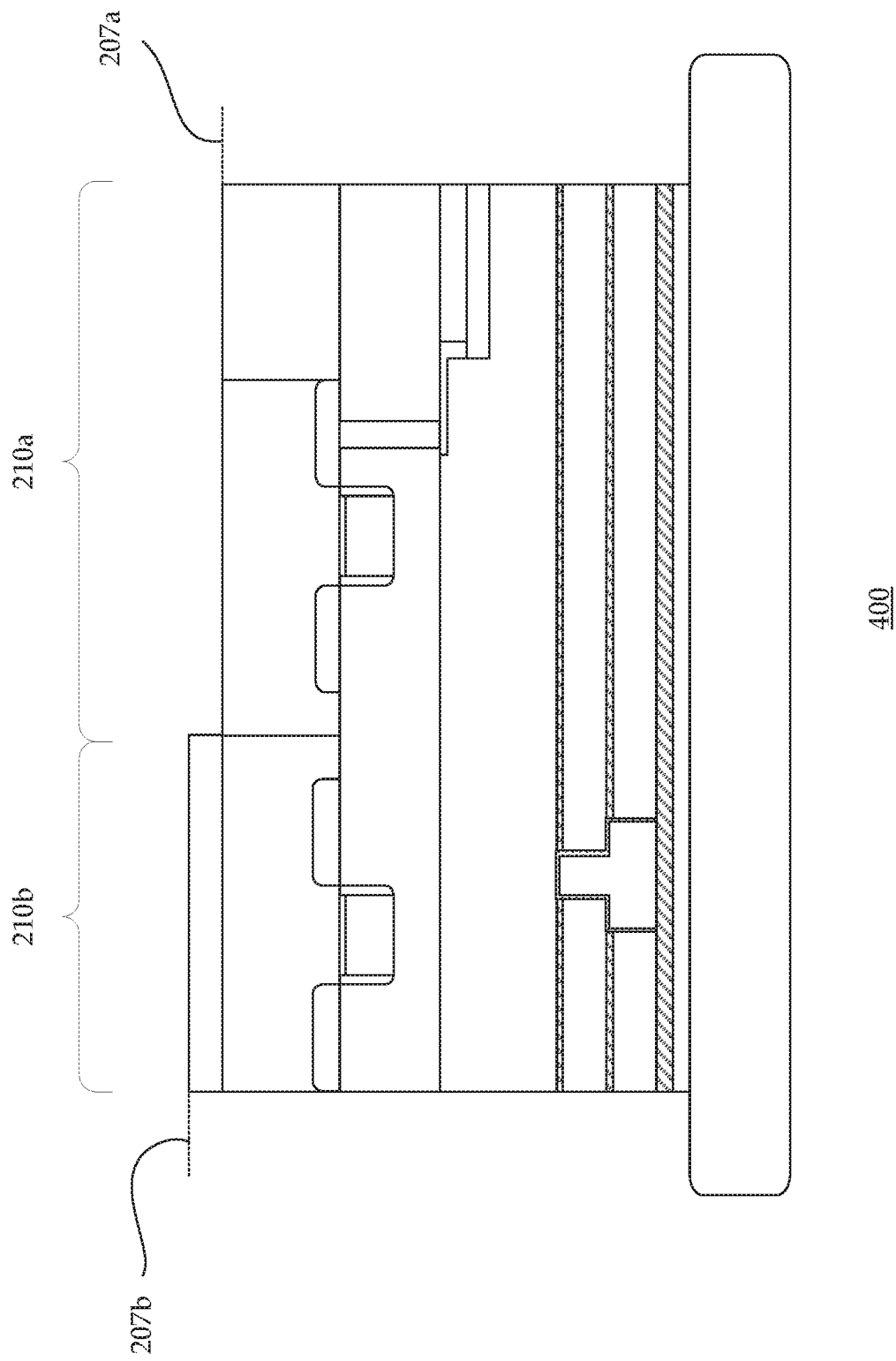

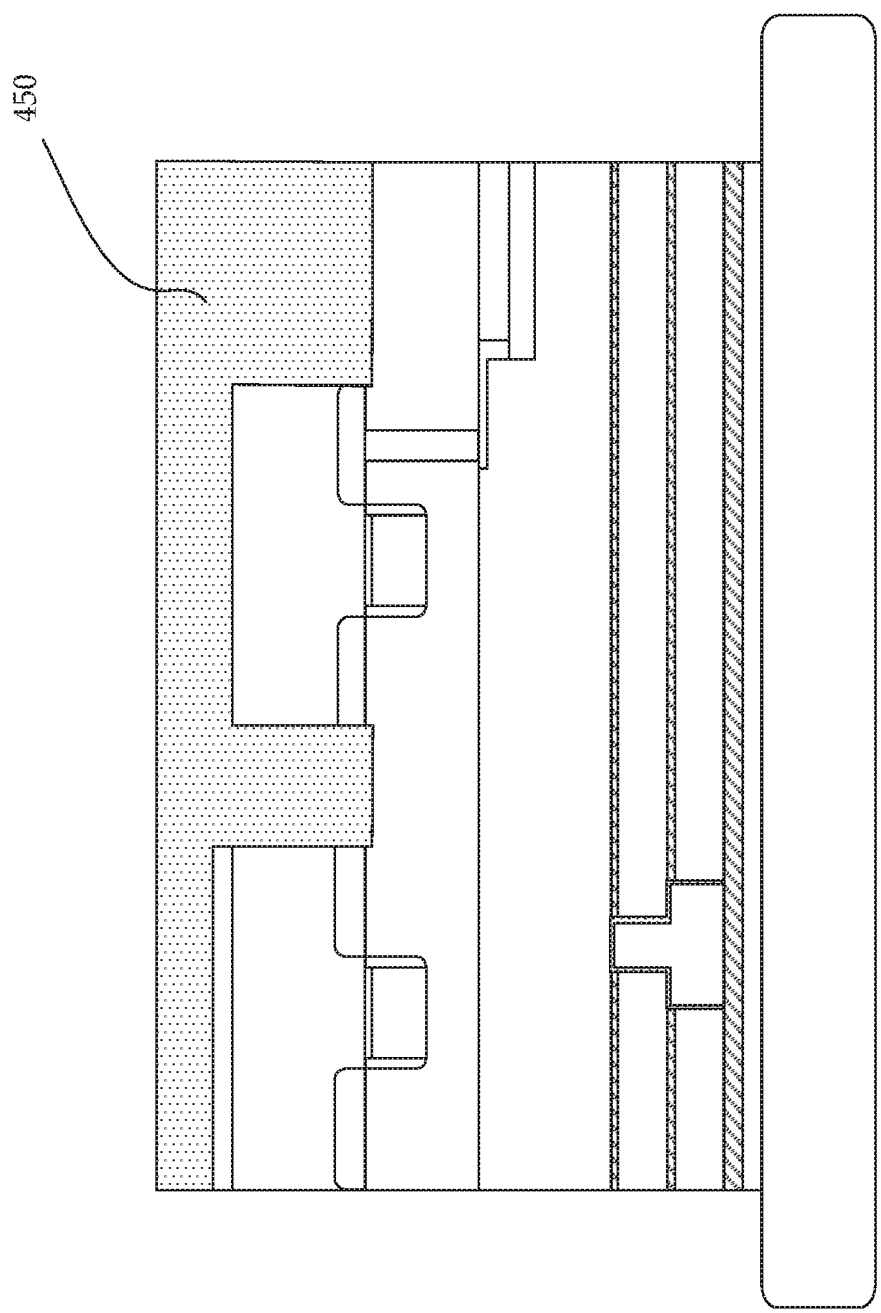

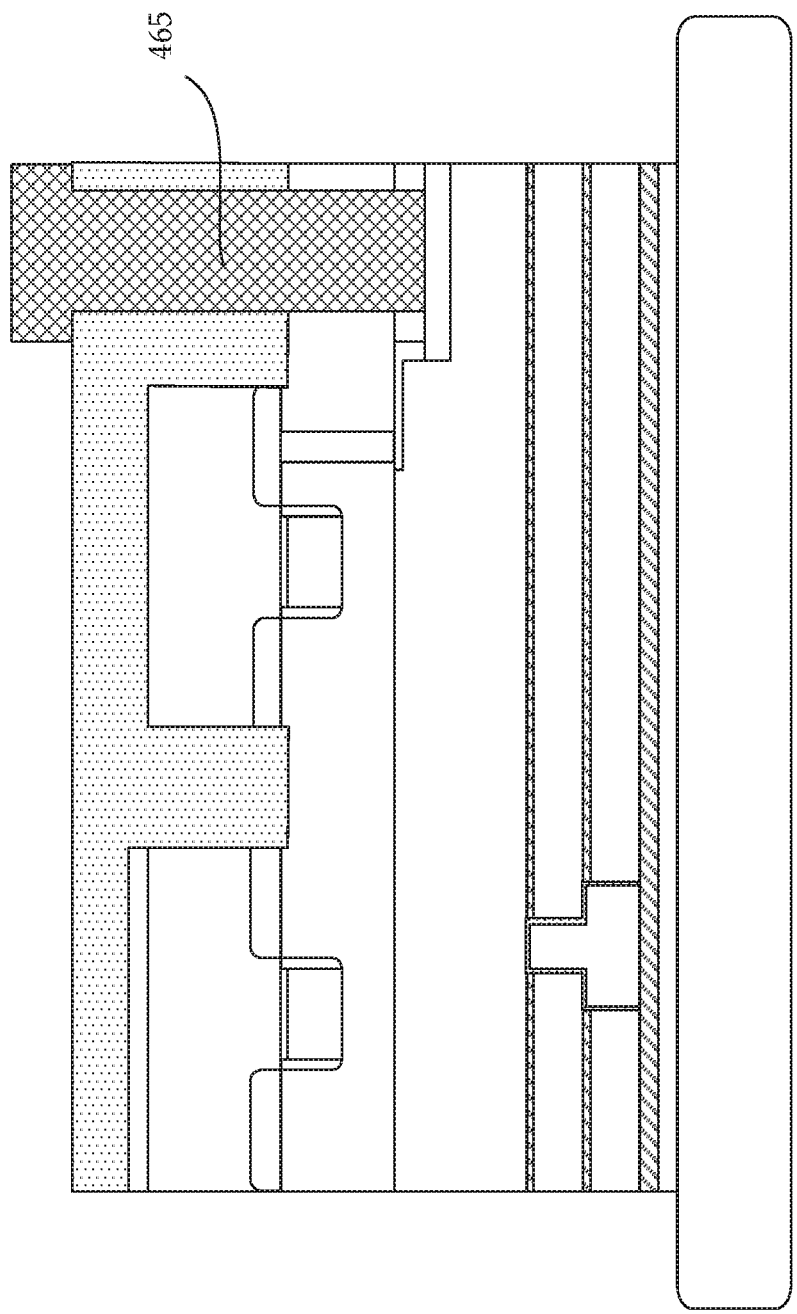

DEVICES AND METHODS OF FORMING THEREOF BY POST SINGLE LAYER TRANSFER FABRICATION OF DEVICE ISOLATION STRUCTURES

BACKGROUND

Generally, integrated circuits (ICs) are formed on a wafer in parallel. An IC includes arious circuit components such as memory array, high voltage (HV) devices and high speed logic circuit elements. The wafer is subjected to dicing in order to singulate the devices. Integration of these different types of devices in a single die or chip involves a number of considerations such as, for example, interference which is prone to occur between the different devices. For example, in the case of RF applications where the devices are the path for a signal transmission or reception, the signal integrity is pivotal because it contains information that need to be treated. The devices neighboring each other such as, for example, switches, low noise amplifiers, filters or power amplifiers will generate a surrounding noise that will limit the performance of a system. To ensure proper transmission and reception, the devices therefore need to be well isolated from each other and from the surrounding devices in the overall system. Another consideration is wafer thickness uniformity in conventional processes for forming the devices which affects device performance. As such, there is a need to properly isolate the different types of devices from each other during integration while providing uniform wafer thickness. Conventional isolation techniques used for isolating the different types of devices poses potential breakdown voltage (BV), cross talk, noise and other reliability issues.

From the foregoing discussion, it is desirable to provide reliable and optimized isolation structures to effectively isolate various devices in a wafer with improved wafer thickness uniformity.

SUMMARY

Embodiments generally relate to semiconductor devices and methods of forming thereof by post layer transfer fabrication of device isolation structures. In one embodiment, a method for forming a device is disclosed. A substrate with first and second major surfaces is provided. Circuit components may be formed on the first major surface of the substrate and a back-end-of-line (BEOL) dielectric layer is formed over the first major surface of the substrate which covers the circuit components. A single layer transfer is performed to expose the second major surface of the substrate for processing. The second major surface of the semiconductor substrate is processed to thin down the wafer, followed by a wafer thickness uniformity improvement process. One or more device isolation structures are formed through the semiconductor substrate from the second major surface of the semiconductor substrate.

In another embodiment, a device is disclosed. The device includes a semiconductor substrate with first and second major surfaces. The first major surface includes circuit components formed thereon and a back-end-of-line (BEOL) dielectric layer disposed over the first major surface of the substrate. One or more device isolation trenches are disposed in the semiconductor substrate from the first major surface to the second major surface. A dielectric layer is disposed over the second major surface of the semiconductor substrate, filling the device isolation trenches which form device isolation structures in the device.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 3a-3g show simplified cross-sectional views of an embodiment of a process for forming a device; and FIGS. 4a-4f show simplified cross-sectional views of an embodiment of another process for forming a device.

DETAILED DESCRIPTION

Embodiments generally relate to semiconductor devices or integrated circuits (ICs). More particularly, embodiments relate to methods for forming device isolation structures in semiconductor devices. Circuit components may be formed on a semiconductor substrate or wafer. The device isolation structures are subsequently formed to isolate devices in the semiconductor substrate. In one embodiment, the device isolation structures are formed from the back side of the semiconductor substrate. The back side of the semiconductor substrate is exposed by performing a single layer transfer process. The back side of the semiconductor substrate is processed to thin down the wafer and improve wafer thickness uniformity prior to forming the device isolation structures. The methods for forming the device isolation structures, for example, may be employed in processes for fabricating devices such as HV devices. Other device fabrication processes may also employ the techniques as will be described. The devices or ICs can be incorporated into or used with, for example, various types of consumer electronic products.

Figure 1:
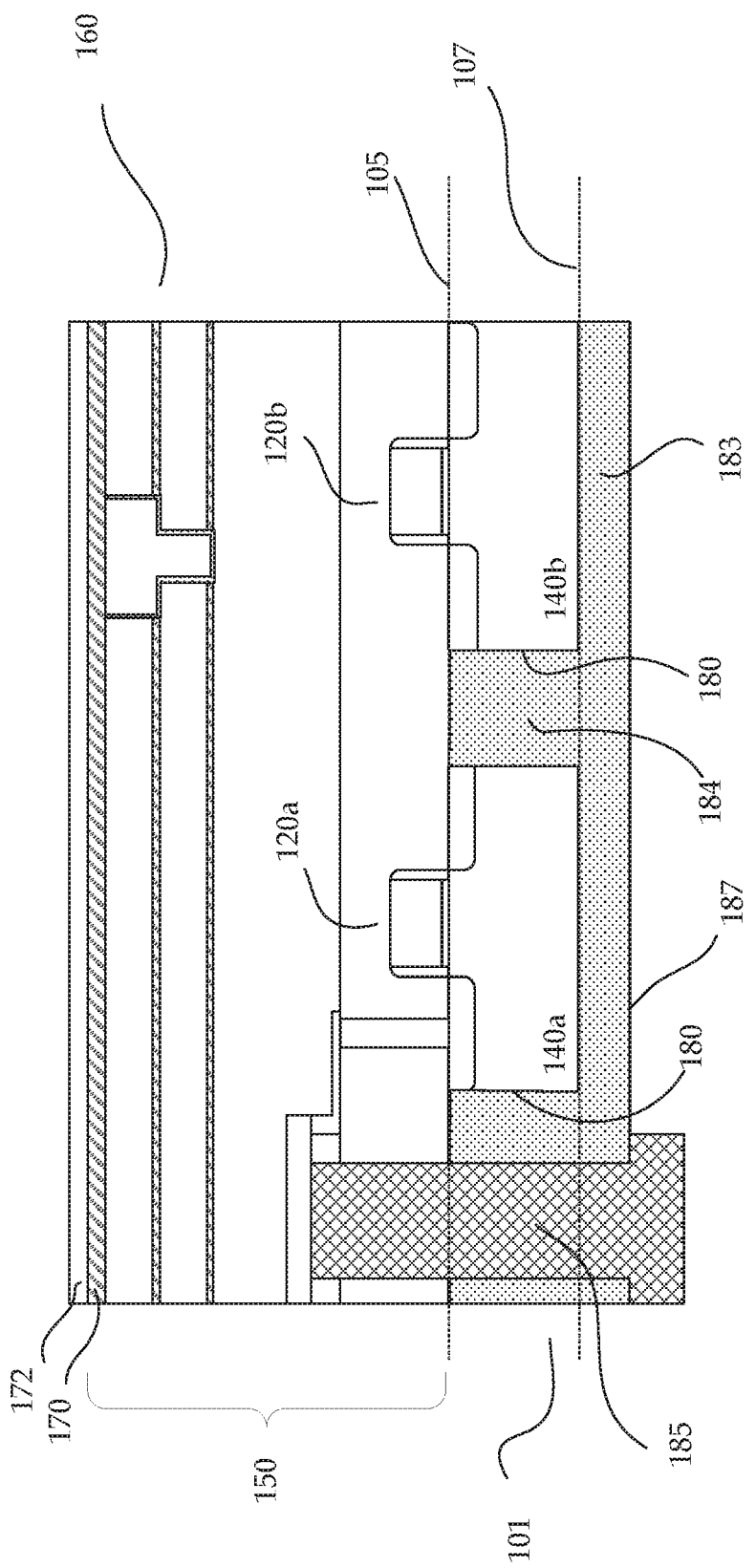
FIG. 1 shows a cross-sectional view of a portion of a device.

FIG. 1 shows a simplified cross-sectional view of an embodiment of a device 100.

The device, for example, is an IC. Other types of devices may also be useful. The device, for example, may be formed in parallel on a wafer and subsequently singulated. The device includes a substrate 101. The substrate includes a first major surface 105 and a second major surface 107. The first major surface may be referred to as the top surface and the second major surface may be referred to as the bottom surface. The first major surface may be an active surface on which active devices are disposed. For example, complementary metal-oxide-semiconductor (CMOS) components are disposed on the first major surface.

The substrate is illustrated with a final substrate thickness. In one embodiment, the device is a fully depleted device, for example, with a final substrate thickness of about 0.005 um to about 0.08 um. In an alternative embodiment, the device may be a partially depleted device, for example, with a final substrate thickness of about 0.08 um and above. The initial thickness of the substrate may be thicker. The final substrate thickness is obtained by etching the second major surface of the substrate having the initial substrate thickness as will be described later. For example, the substrate may have an initial thickness of 775 um and thinned to the final substrate thickness. The substrate may have other initial and final thicknesses. In one embodiment, the first and second major surfaces of the substrate are substantially planar surfaces.

In one embodiment, the substrate may be a bulk semiconductor substrate. The bulk substrate has a homogenous material. For example, the bulk substrate has a single crystalline material such as Si material. Providing the bulk substrate with other types of single crystalline material, such as germanium, may also be useful. Alternatively, the substrate may be a crystal-on-insulator (COI) substrate. A COI substrate includes a thin surface substrate and a bulk substrate separated by an insulator layer, such as buried oxide layer (BOX). In the case of a COI substrate, the bulk substrate includes the second major surface and may be a silicon bulk. As for the surface substrate which includes the first major surface (e.g, active surface), it may be silicon or other types of surface substrates. For example, the surface substrate may be a gallium nitride (GaN) or a aluminum phosphide (AlP) substrate. The final substrate thickness, for example where a silicon-on-insulator (SOI) substrate is employed, is obtained by thinning down to the BOX layer from the second major surface or back side of the SOI substrate. The BOX may serve as an etch stop layer.

In one embodiment, the circuit components are disposed on the first major surface of the substrate. The circuit components, for example, include CMOS transistors 120a-120b disposed in transistor regions. A transistor well is disposed in a transistor region. The transistor well includes second polarity type dopants for a first polarity type transistor. For example, a p-well is provided for an n-type transistor while an n-well is provided for a p-type transistor. As illustrated, first and second device wells 140a and 140b are disposed in the substrate. In one embodiment, the device wells are lightly doped device wells. For example, the dopant concentration of a device well is, for example, about 5e16/cm$^2$. In the case of a fully depleted device, the depth of the device wells, for example, is the same as the final substrate thickness of the semiconductor substrate. For example, the device wells extend through the first and second major surfaces of the substrate. Other suitable depths and configurations for the device wells may also be useful. For example, in the case of a partially depleted device, the depth of the device wells extends from the first major surface to a portion of the semiconductor substrate.

The transistor includes a gate disposed on the first major surface of the substrate and first and second source/drain (S/D) regions on first and second sides of the gate. The gate includes a gate electrode over a gate dielectric. The S/D regions are first polarity type doped regions, corresponding to a first polarity type device. In one embodiment, the CMOS transistors include both n-type and p-type transistors. The CMOS transistors, including wells, may be referred to as front-end-of-line (FEOL) components. The FEOL components may be configured to include various digital circuits such as row/column decoders, pixel driver circuits, pixel correction circuits and HDMI/LDVS interface circuits. Other types of FEOL components or circuits may also be useful.

A back-end-of-line (BEOL) dielectric layer 150 is disposed over the FEOL components on the first major surface of the substrate. The BEOL dielectric layer includes a plurality of interlevel dielectric (ILD) levels. The number of ILD levels depends on, for example, design requirements or the logic process involved. An ILD level includes a contact level with via contacts and metal level with metal lines. Via contacts and metal lines are illustrated in first and second ILD levels of the BEOL dielectric. An ILD level may be formed using various BEOL processes. For example, single damascene, dual damascene, and/or reactive ion etch techniques may be employed. Other techniques may also be employed to form ILD levels of the BEOL dielectric.

In one embodiment, a metal line in a metal level of the BEOL dielectric may further include a seed layer lining the metal line. For example, a seed layer is formed prior to forming the metal line of a metal level. The seed layer, for example, may be formed of Ta and TaN layers. Providing a seed layer formed of other materials may also be useful. The contacts may be tungsten or copper contacts while the metal lines may be copper lines. Other types of contacts and metal lines may also be useful. The contacts and metal lines of a metal level may be of the same type of conductive material or of different types of materials. The BEOL dielectric may include pad level 160 with pad contacts for external connection and a redistribution layer. The pad contacts enable external connections to circuit components on the first major surface of the substrate through the metal interconnections in the BEOL dielectric. A silicon nitride (SiN) 170 and a TEOS layer 172 may be disposed over the wafer. For example, the SiN and TEOS layers may be protective layers covering the metal interconnects in the BEOL dielectric. Additionally, a passivation layer may be disposed over the wafer (not shown). Alternatively, the passivation layer may be disposed over the wafer at other stages of processing the wafer.

In one embodiment, one or more device isolation trenches 180 are disposed in the substrate. The device isolation trenches extend through the substrate. For example, the device isolation structures extend from the first major surface to the second major surface of the substrate. The device isolation trenches, for example, have a same depth as the final thickness of the substrate. Providing device isolation trenches with other depths may also be useful.

A dielectric layer 183 may be disposed over the second major surface of the semiconductor substrate and in the device isolation trenches. For example, the dielectric layer is disposed on the back side of the substrate and fills the device isolation trenches. The dielectric layer filling a device isolation trench forms a device isolation structure 184 in the substrate. In one embodiment, the device isolation structure may be a shallow trench isolation (STI) structure. Alternatively, the device isolation structure may be a deep trench isolation structure. The device isolation structures isolate devices in the substrate. For example, the device isolation structures isolate the CMOS components in the substrate. For example, the isolation regions isolate the CMOS transistors in the transistor regions. The device isolation structures, for example, surround a transistor region. Additionally, the device isolation structures may isolate the transistor regions from other component regions.

The dielectric layer disposed over the second major surface of the semiconductor substrate and in the device isolation trenches may be oxide material. For example, the dielectric layer may be a silicon oxide layer. Providing other types of dielectric material for the device isolation structures may also be useful.

In one embodiment, a via contact 185 may be disposed through the substrate from its back side and extends into a portion of the BEOL dielectric layer to provide external connection to the circuit components. For example, the via contact extends through the substrate from the second major surface and into a portion of the BEOL dielectric layer to contact a metal line in a metal level of the BEOL dielectric. The via contact, in one embodiment, may be disposed in and extends through a device isolation structure in the substrate. For example, the via contact extends from a top surface of the dielectric layer 187 through the device isolation structure in the semiconductor substrate and into a portion of the BEOL dielectric layer. For example, the via contact extends from the second major surface of the substrate to the second ILD level in the BEOL dielectric. The via contact may be coupled to the metal line in the second ILD level.

Figure 2:
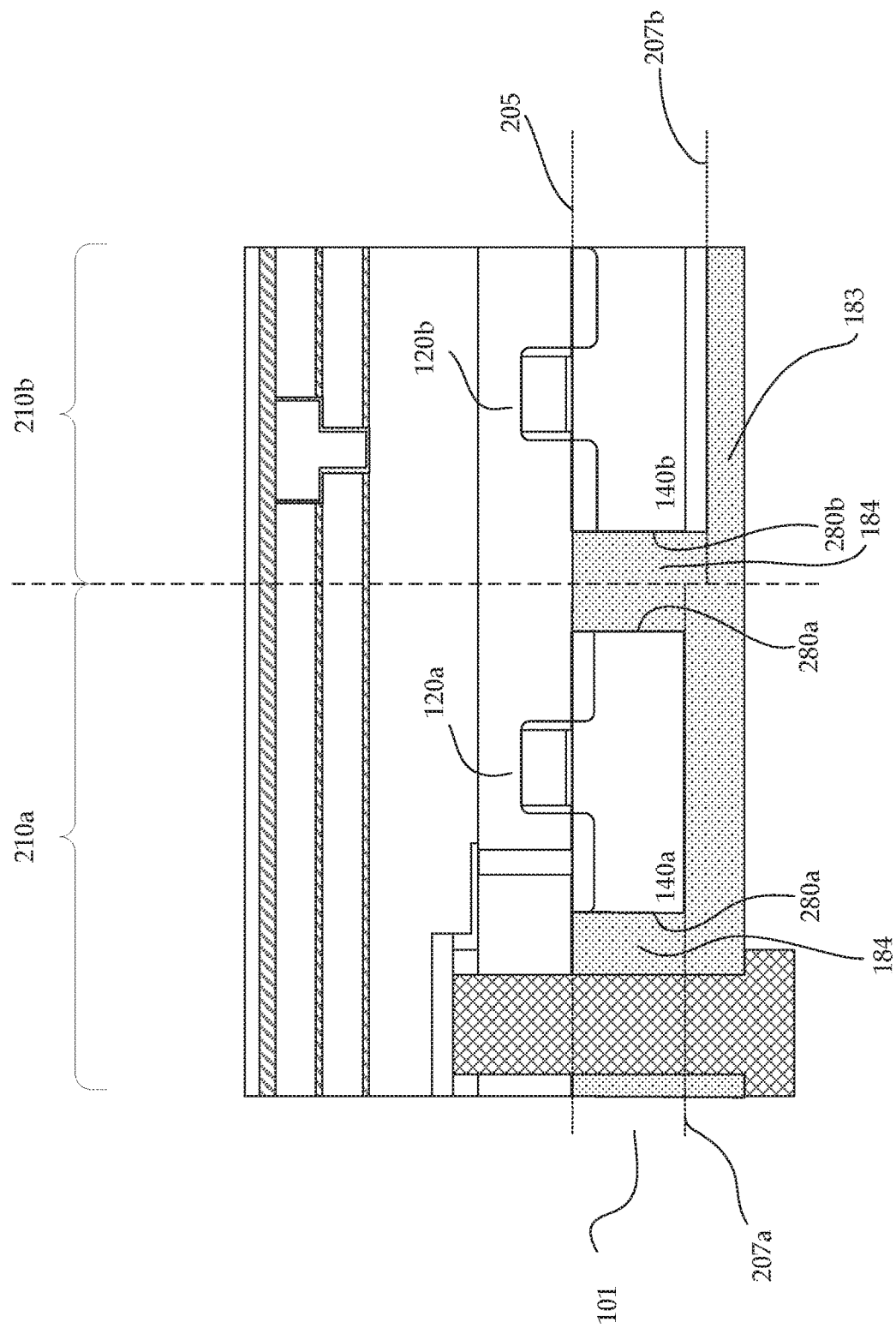
FIG. 2 shows a simplified cross-sectional view of another embodiment of a device.

FIG. 2 shows a simplified cross-sectional view of another embodiment of a device 200. The device is similar to the device shown in FIG. 1. Common elements may not be described or described in detail. The device 200 includes a fully depleted and a partially depleted portion. For example, the substrate 101 with the CMOS transistors includes a fully depleted portion 210a and a partially depleted portion 210b.

In the case of a substrate with fully depleted and partially depleted portions, the first major surface 205 of the substrate is substantially planar while the second major surface of the substrate is disposed on first and second planes 207a and 207b for the fully depleted portion 210a and the partially depleted portion 210b respectively. In one embodiment, the first and second planes are different. For example, the second plane 207b in the partially depleted portion extends beyond the first plane 207a in the fully depleted portion with respect to the first major surface of the substrate.

The substrate as illustrated has two different final substrate thicknesses for the fully depleted and partially depleted portions. For example, the substrate has a first final substrate thickness in the fully depleted portion and a second final substrate thickness in the partially depleted portion. For example, the substrate with the fully depleted portion has a final substrate thickness of about 0.005 um to about 0.08 um, while the substrate with the partially depleted portion has a final substrate thickness of about 0.08 um and above. The different final substrate thicknesses are obtained by localized etching of an initial substrate thickness using separate etch masks as will be described. Providing the substrate with other initial and final thicknesses may also be useful.

In one embodiment, one or more device isolation trenches 280a-280b are disposed in the substrate. The device isolation trenches extend through the substrate. For example, the device isolation structures extend from the back side or second major surface of the substrate to the first major surface. In the case of device isolation trenches in the fully depleted portion of the substrate, device isolation trenches 208a extend from the second major surface on the first plane 207a to the first major surface, while for device isolation trenches disposed in the partially depleted portion of the substrate, the device isolation trenches extend from the second major surface on the second plane 207b to the first major surface. The device isolation trenches, for example, have a same depth as the final thickness of the substrate. Providing device isolation trenches with other depths may also be useful.

A dielectric layer 183 may be disposed over the second major surface of the semiconductor substrate and in the device isolation trenches. For example, the dielectric layer is disposed on the back side or bottom surface of the substrate and fills the device isolation trenches. The dielectric layer filling the device isolation trenches forms device isolation structures 184 in the substrate. In one embodiment, a device isolation structure may be a shallow trench isolation (STI) structure. Alternatively, the device isolation structure may be a deep trench isolation structure. The device isolation structures isolate devices in the substrate. For example, the device isolation structures isolate the CMOS components in the substrate. The device isolation structures, for example, surround a transistor region. Additionally, the device isolation structures may isolate the transistor regions from other component regions.

The dielectric layer disposed over the second major surface of the semiconductor substrate and in the device isolation trenches may be oxide material. For example, the dielectric layer may be a silicon oxide layer. Providing other types of dielectric material for the device isolation structures may also be useful.

FIGS. 3a-3g show simplified cross-sectional views of an embodiment of a process 300 for forming a device. The device, for example, is similar to that described in FIG. 1. Common elements may not be described or described in detail.

Figure 3A:
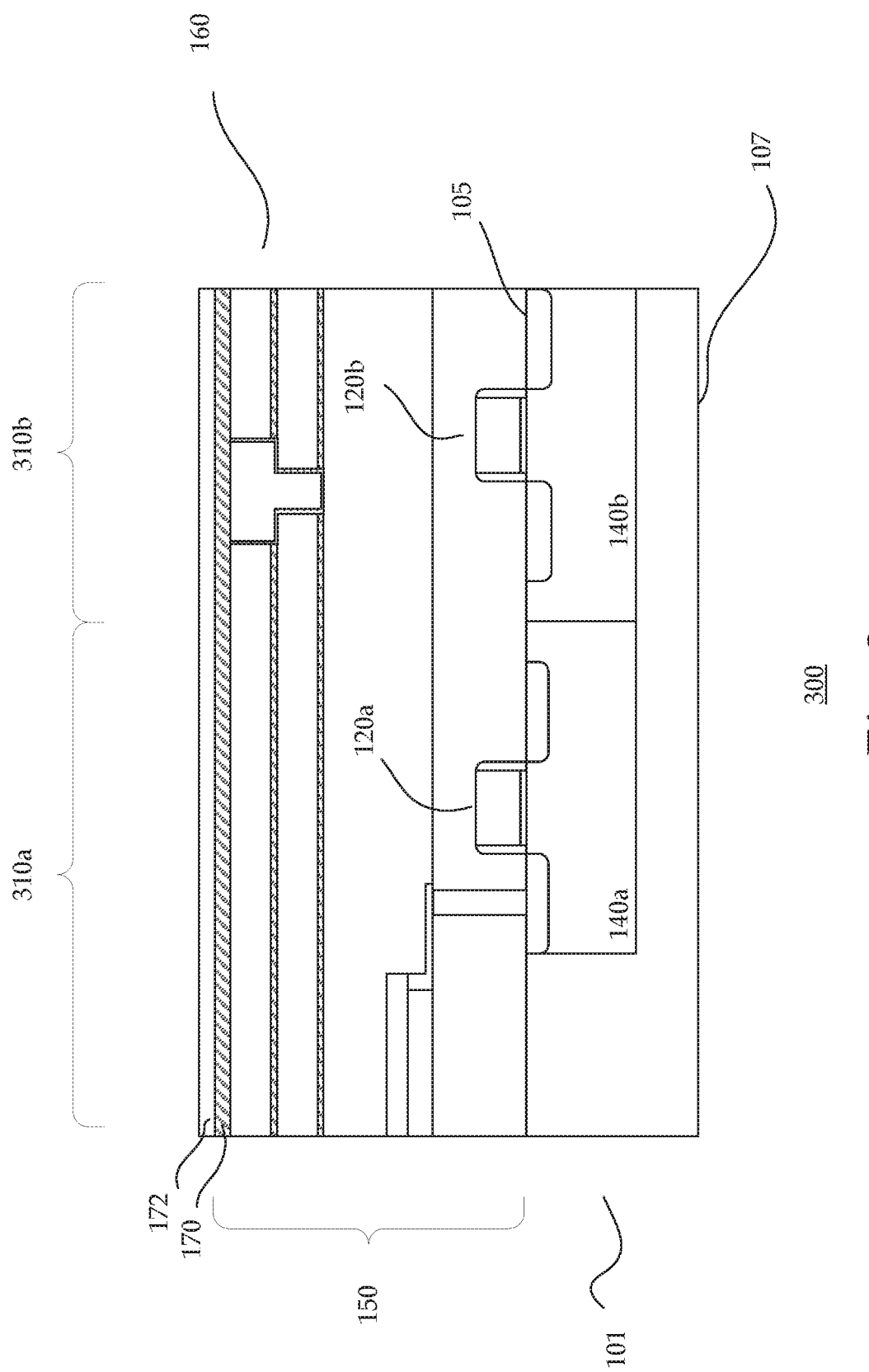

Referring to FIG. 3a, a wafer with device components is provided. The wafer includes a substrate 101. The substrate includes first and second major surfaces 105 and 107. The first major surface may be referred to as the top surface and the second major surface may be referred to as the bottom surface of the substrate. The substrate, in one embodiment, is a bulk semiconductor substrate, such as a bulk silicon (Si) substrate. In one embodiment, the bulk substrate has a homogenous material. For example, the bulk substrate has a single crystalline material such as Si material. Providing other types of bulk substrates may also be useful. For example, the bulk substrate may include germanium (Ge), gallium nitride (GaN) or an epi of those crystalline materials on a low cost material. In some embodiments, the bulk semiconductor substrate may be a doped substrate, such as a lightly doped p-type (p) substrate. The substrate may be doped with other types of dopants or dopant concentrations. Providing a bulk wafer as the starting material advantageously reduces material cost in comparison to using a COI as the starting material. Alternatively, the substrate may be a crystal-on-insulator (COI) substrate such as a silicon-on-insulator.

For purpose of illustration, the cross-sectional view only shows a portion of a device on the substrate. However, it should be understood that the substrate may be a wafer on which a plurality of devices are formed. For example, the substrate is a wafer which is processed to form a plurality of devices in parallel. After the devices are formed, the wafer is diced to singulate the devices.

The substrate, for example, may have an initial thickness of about 775 um. In one embodiment, the substrate includes various device regions. The substrate, for example, includes first and second device regions 310a and 310b. The substrate may be processed to form active devices components in the device regions. For example, the substrate may be processed to form circuit components such as CMOS components on the first major surface of the substrate. For purposes of illustration, the substrate is processed to include first and second CMOS transistors 120a-120b in the first and second device regions. It should be understood that the substrate may include other device regions. The CMOS components may be formed using FEOL processing. In one embodiment, the FEOL processing is without fabrication of device isolation structures such as STIs. For example, CMOS processing performed on the bulk semiconductor wafer skips the STI fabrication. The device isolation structures, in one embodiment, are formed through the back side of the substrate a later stage of processing, as will be described.

A transistor may include a device well which serves as a body for the transistor. A device well, for example, encompasses the device region. The device well is a doped well in the substrate. The doped well, for example, extends from the first major surface of the substrate to a desired depth of the substrate. The device wells of the transistors may include second and first polarity type wells which serve as bodies of first and second polarity type transistors. For example, the device wells include p-type and n-type device wells which serve as bodies of n-type and p-type transistors. The device wells may be lightly or intermediately doped device wells. The device wells may be formed by implants using implant masks, such as photoresist masks. Alternatively, the implant may be a blanket implant performed without an implant mask.

A gate of a transistor is formed on the first major surface of the substrate in the device region. A gate includes a gate electrode over a gate dielectric. The gate electrode, for example, may be polysilicon while the gate dielectric may be silicon oxide. Other types of gate electrodes or gate dielectrics may also be useful. The gate dielectric may be formed by depositing a gate dielectric layer using thermal oxidation while the gate electrode may be a formed by depositing a gate electrode layer by using chemical vapor deposition (CVD) techniques. The gate layers are patterned to form gates. The gate layers may be patterned using mask and etch techniques.

First and second source/drain (S/D) regions are formed in the device well adjacent to the first and second sides of the gate. The S/D regions are first polarity type doped regions corresponding to a first polarity type device. The S/D regions, for example, may be formed by mask and implant techniques. Metal silicide contacts (not shown) may be formed on the S/D regions and on the gate electrodes. The metal silicide contacts, for example, may be nickel-based contacts. Other types of metal silicide contacts may also be useful. For example, the metal silicide contact may be cobalt silicide (CoSi). The metal silicide contacts may be employed to reduce contact resistance and facilitate contact to the back-end-of-line (BEOL) metal interconnects.

A BEOL dielectric layer 150 is formed on the first major surface of the substrate. The BEOL dielectric covers the circuit components. The BEOL dielectric provides electrical interconnections to the circuit components. The BEOL dielectric includes a plurality of interlevel dielectric (ILD) levels. An ILD level includes a contact level with via contacts and metal level with metal lines. The via contacts couple the contact regions of the transistors to metal lines disposed in metal levels of the device. An ILD level may be formed using various processes. For example, single damascene, dual damascene, and/or reactive ion etch techniques may be employed. Other techniques may also be employed to form ILD levels of the BEOL dielectric. The contacts may be tungsten or copper contacts while the metal lines may be copper lines. Other types of contacts and metal lines may also be useful.

In one embodiment, a metal level may further include a seed layer lining the metal line in a metal level. For example, a seed layer is formed prior to forming the metal line of a metal level. The seed layer, for example, may be formed of Ta and TaN layers. Providing a seed layer formed of other materials may also be useful. The BEOL dielectric, for example, may include about five ILD levels. Providing a BEOL dielectric with other number of ILD levels may also be useful. The top ILD level may serve as a pad level 160 which includes pad contacts for external connections to the device. A silicon nitride (SiN) 170 and a TEOS layer 172 may be formed over the wafer. For example, the SiN layer may be formed over the BEOL dielectric, and a TEOS layer may be formed over the SiN layer. For example, the SiN and TEOS layers may be protective layers covering the metal interconnects in the BEOL dielectric. Additionally, a passivation layer may be formed over the wafer (not shown). Alternatively, the passivation layer may be formed over the wafer at other stages of processing the wafer.

The process continues with processing the back side or opposite side of the substrate. For example, the second major surface of the substrate is processed after processing of its first major surface. In one embodiment, the second major surface of the substrate is exposed by bonding it to another wafer 320 which serves as a carrier substrate. For example, a single layer transfer (SLT) process is performed to expose the second major surface of the substrate. The wafer bonding may be performed in low temperature and is a high rate wafer bonding. Other techniques for exposing the back side of the substrate may also be useful. FIG. 3b illustrates the substrate 101 inverted after bonding to the carrier substrate. As shown, the substrate is bonded to the carrier substrate with its first major surface facing the carrier substrate. For example, the active surface 105 of the substrate 101 faces the carrier substrate while the inactive surface or back side 107 of the substrate is exposed or accessible for processing. The carrier substrate, for example, may be silicate, or aluminum nitride wafer. Other types of carrier substrates may also be useful.

After bonding to the carrier substrate, first and second etching processes are performed on the second major surface or back side of the substrate 101. In one embodiment, a first etch process is performed on the second major surface of the semiconductor substrate to thin the wafer. For example, the semiconductor substrate is processed to reduce the thickness of the substrate. The etch process etches the semiconductor substrate material. For example, the first etch process etches the semiconductor substrate which is formed of homogenous material. The first etch process etches the semiconductor substrate to provide a substantially planar second major surface across the device region.

The substrate may be etched to reduce its thickness depending on the device requirements. An etch mask is deposited on the second major surface of the substrate and patterned to expose the device region for the first etch process. The mask, for example, may include a hard mask such as silicon nitride, and soft mask such as a photoresist. In one embodiment, the first etch process for thinning the wafer includes wet etching. In another embodiment, the first etch process may be dry etching. Other thinning processes may also be used to thin the substrate such as wet alkaline etching, grinding, chemical mechanical polishing (CMP) or a combination thereof.

Figure 3C:
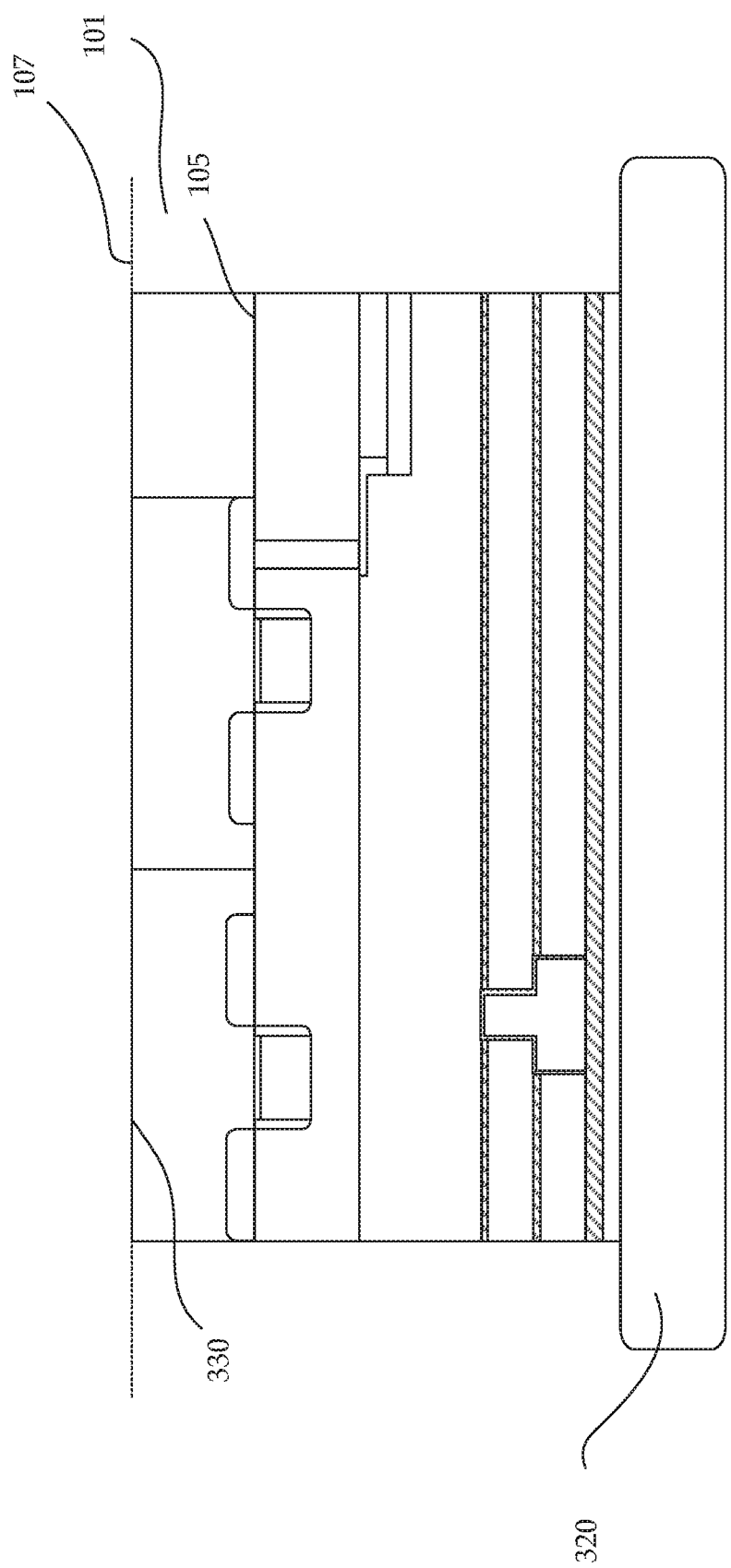

FIG. 3c shows an exemplary embodiment of the wafer with a substantially planar second major surface 107 after the first etch process. The substrate, for example, is etched to form a fully depleted device. For example the substrate is etched until a bottom surface 330 of the transistor wells is exposed. Etching the substrate to other depths may also be useful. For example, in the case where the substrate is etched to form a partially depleted device, the bottom surface of the transistor wells may not be exposed.

In one embodiment, a second etch process is performed after the first etch process to improve the substrate or wafer thickness uniformity. The etch process further etches the semiconductor substrate material to improve the wafer thickness uniformity. For example, the second etch process etches the semiconductor substrate which is formed of the homogenous crystalline material. As described earlier, the first major surface of the semiconductor wafer is processed without STI fabrication, allowing the wafer thickness uniformity improvement process on the back side of the substrate to be an etch of the bulk substrate with homogeneous material. For example, only silicon material is etched as the uniformity improvement is performed on the second major surface of the substrate.

The second etch process to improve the wafer thickness uniformity, in one embodiment, may be a gas cluster ion beam (GCIB) process. In another embodiment, the second etch process to improve the wafer thickness uniformity may be a selective etching. The selective etch, for example, may employ an etch which includes HF, $CH_3COOH$, $HNO_3$. Providing other types of processes for improving the uniformity of the wafer thickness may also be useful. The etch mask is removed after the second etch process.

In the case of a partially depleted device, the final substrate thickness after the first and second etch process, for example, may be of a few 100 A (e.g., 800 A and above), while in the case of a fully depleted device, the final substrate thickness may be about of a few 100 A (e.g., 800 A and below).

The process continues with forming one or more device isolation structures in the substrate through the second major surface. For example, one or more STIs are formed in the substrate to isolate the circuit components such as the CMOS transistors. The process to form the device isolation structures includes forming isolation trenches corresponding to the device isolation structures to be formed in the substrate. The trenches may be formed by mask and etch techniques. In one embodiment, a hard mask, such as silicon oxide or silicon nitride, is used. The hard mask may be patterned by a photoresist layer which is exposed with an exposure source using a reticle with the desired pattern which corresponds to the one or more isolation trenches to be formed. The pattern on the resist mask is transferred to the hard mask by an etch, such as reactive ion etch (ME). Other types of etch processes may also be useful. The hard mask is then used to etch the substrate to form the isolation trenches.

FIG. 3d illustrates isolation trenches 340 formed in the substrate. In one embodiment, the isolation trenches extend through the substrate from the second major surface to the first major surface of the substrate. The isolation trenches may be formed to a depth equivalent to the final substrate thickness. The hard mask layer and photoresist is removed after forming the isolation trenches. Other techniques for forming the isolation trenches may also be useful.

The process continues with depositing a dielectric layer 350 over the second major surface of the substrate which fills the isolation trenches as shown in FIG. 3e. The dielectric layer filling the isolation trenches forms the device isolation structures in the substrate. The dielectric layer may be an oxide layer such as silicon oxide. Providing other types of dielectric layers may also be useful. The dielectric layer is formed by, for example, chemical vapor deposition (CVD). Other techniques may also be useful to form the dielectric layer.

A polishing process such as chemical mechanical polishing (CMP) may be optionally performed after deposition of the dielectric layer. The polishing process may be performed depending on process requirements. For example, a CMP process may be performed in the case additional bonding is required for other device integration.

Figure 3F:
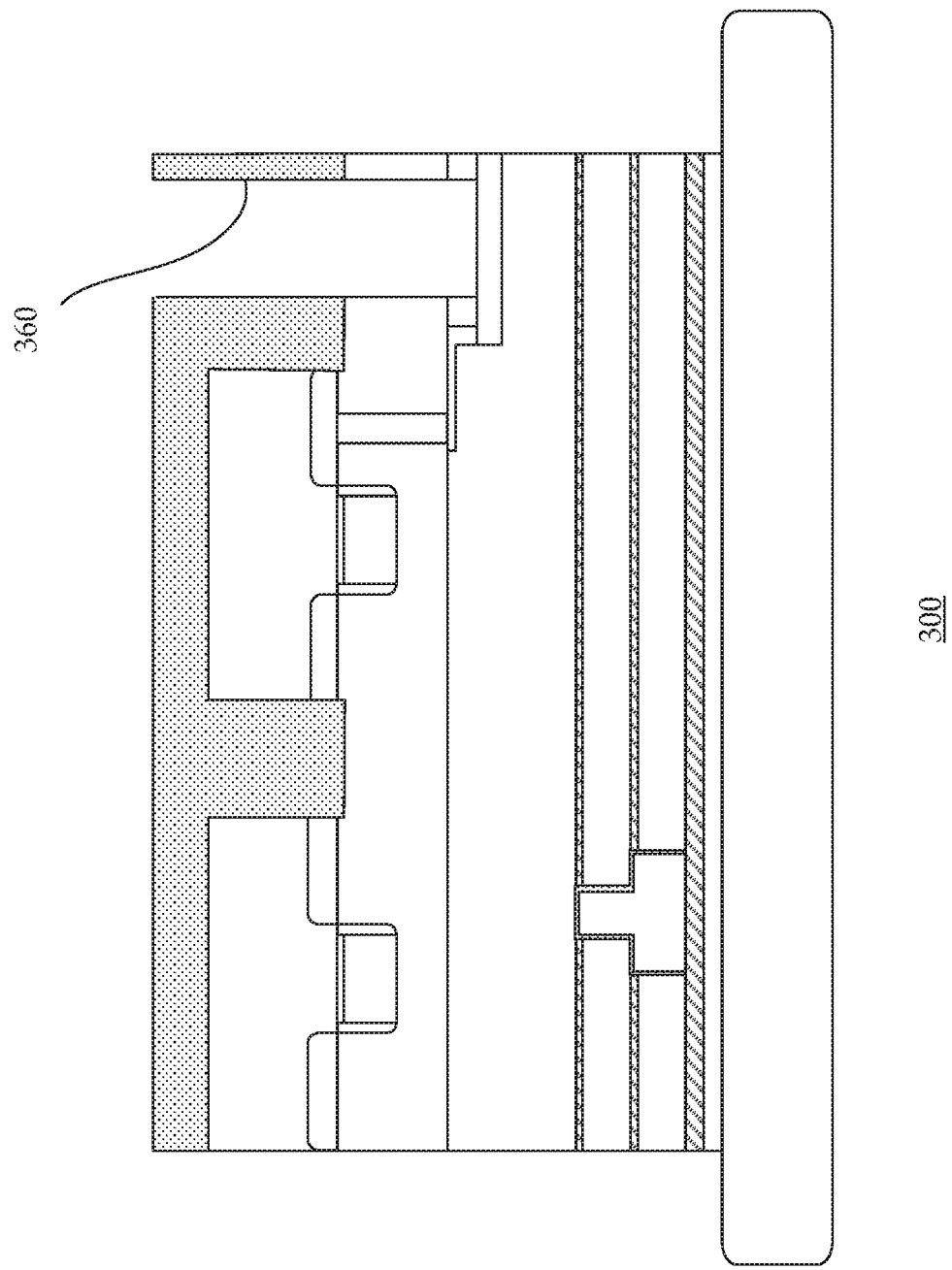

In one embodiment, a via contact may be formed through the substrate from the second major surface to contact a metal line in the BEOL dielectric. The via contact may extend from a top surface of the dielectric layer which is formed over the second major surface of the substrate and through the dielectric layer in the substrate to contact a metal line in a metal level of the BEOL dielectric. Referring to FIG. 3f, a via opening 360 is formed through a device isolation structure in the substrate and extends into a portion of the BEOL dielectric until it reaches a metal level in the BEOL dielectric. The via opening may extend into a portion of the BEOL dielectric until it exposes a seed layer which lines a metal line. For example, the via opening may expose the second metal level. Providing the via opening which exposes other metal levels may also be useful.

The via opening may be formed using mask and etch techniques. For example, a reactive ion etch (ME) is performed using an etch mask to form the via opening. In one embodiment, the seed layer lining the metal line in a metal level of the BEOL dielectric to which the via contact is to contact may serve as an etch stop layer for forming the via opening. For example, Ta and TaN seed layers in a desired metal level to which the via contact connects serve as the etch stop layer for forming the via opening.

Figure 3G:
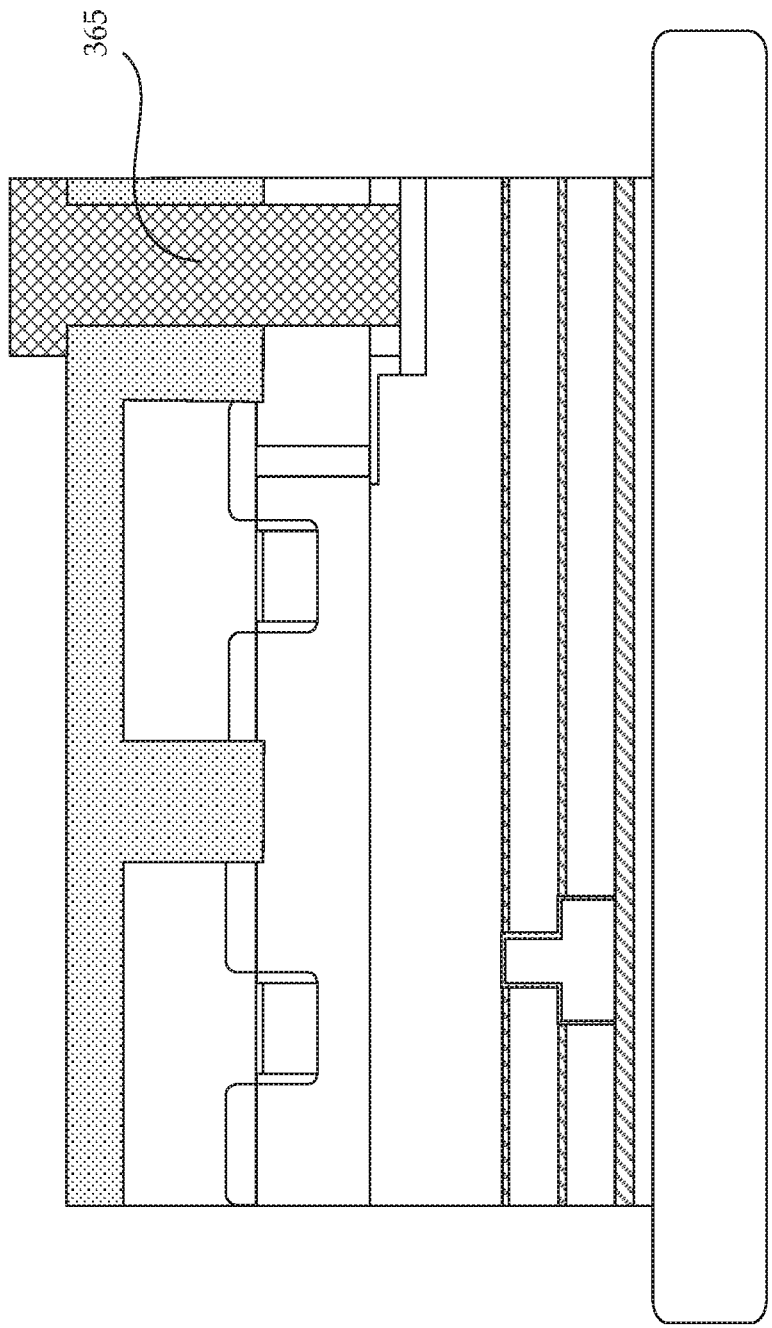

Referring to FIG. 3g, a conductive material, such as aluminum (Al), is deposited over the second major surface and fills the via opening, forming via contact 365. Providing other types of conductive material such as copper may also be useful. A planarization process, such as CMP, may be performed to remove excess conductive material. As shown, the via contact which is formed from the back side of the substrate provides electrical connection from the second major surface of the substrate to a metal line in the BEOL dielectric on the first major surface. The carrier substrate may subsequently be removed. The wafer may proceed to packaging. Other processes may also be performed to complete the device.

FIGS. 4a-4f show simplified cross-sectional views of an embodiment of a process 400 for forming a device. The device, for example, is similar to that described in FIG. 2. Common elements may not be described or described in detail.

Figure 4A:
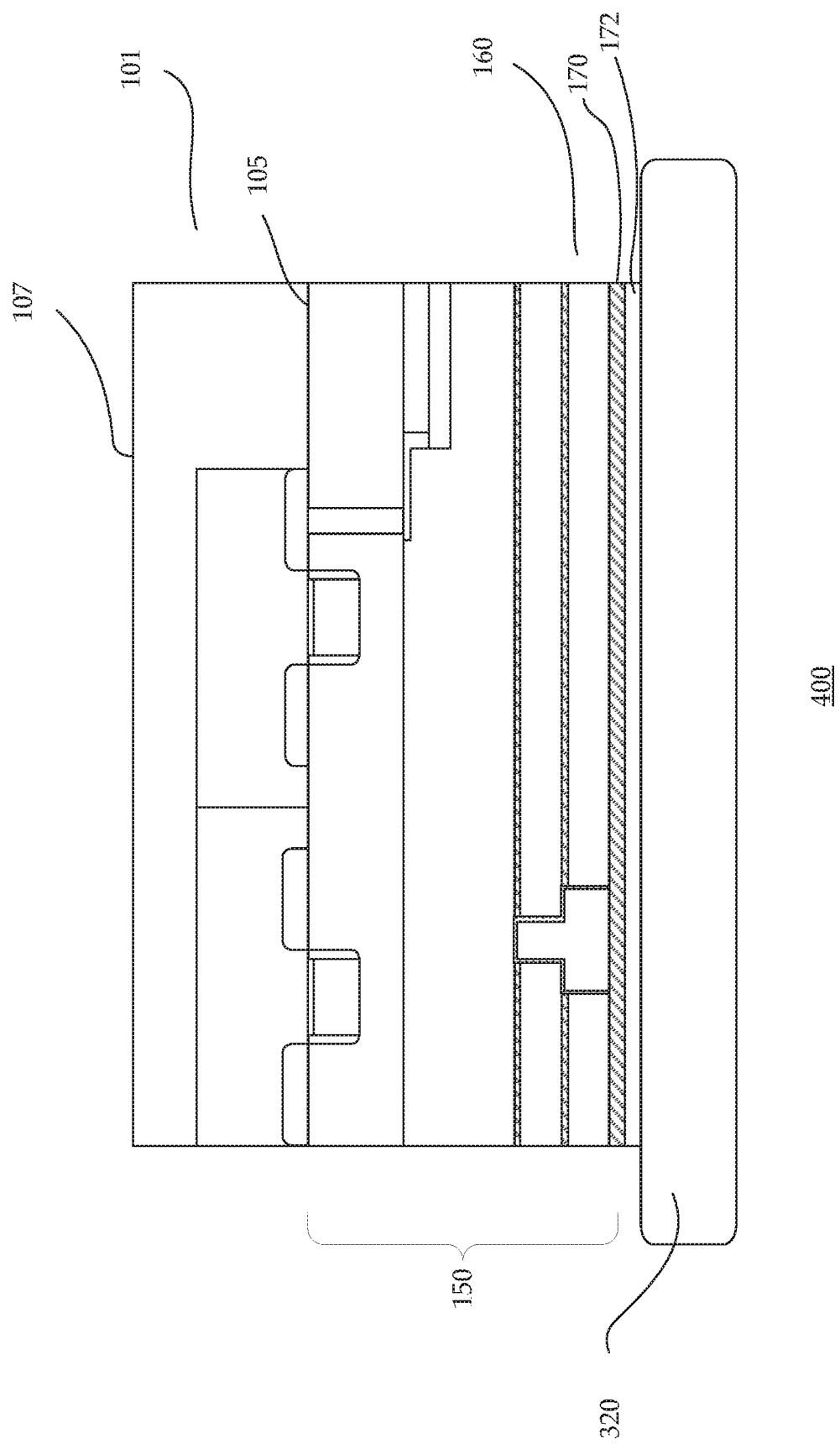

Referring to FIG. 4a, a wafer with device components is provided. The wafer may be similar to the wafer as described with respect to FIG. 3a. For example, the wafer includes substrate 101 with first and second major surfaces 105 and 107. The first major surface may be referred to as the top surface and the second major surface may be referred to as the bottom surface of the substrate. The substrate, in one embodiment, is a bulk semiconductor substrate, such as a bulk silicon (Si) substrate. The bulk substrate may have a homogenous material. For example, the bulk substrate has a single crystalline material such as Si material. Providing other types of bulk substrates may also be useful. Alternatively, the substrate may be a crystal-on-insulator (COI) substrate.

The substrate, for example, may have an initial thickness of about 775 um. The substrate may include various device regions in which active devices components are formed as described with respect to FIG. 3a. For example, the bulk substrate may be processed to form circuit components such as CMOS transistors on the first major surface of the substrate. The CMOS transistors may be formed using FEOL processing. For example, transistors with device wells, gates, and S/D regions are formed. In one embodiment, the FEOL processing is without fabrication of isolation structures for isolating the devices. For example, FEOL processing performed on the bulk semiconductor wafer skips STI fabrication. The device isolation structures are similarly formed from the back side of the substrate at a later stage of processing, as will be described.

A BEOL dielectric layer 150 is formed on the first major surface of the substrate. The BEOL dielectric covers the circuit components. The BEOL dielectric provides electrical interconnections to the circuit components. The BEOL includes a plurality of interlevel dielectric (ILD) levels. An ILD level includes a contact level with via contacts and metal level with metal lines. The via contacts couple the contact regions of the transistors to metal lines disposed in metal levels of the device. An ILD levels may be formed using various processes. For example, single damascene, dual damascene, and/or reactive ion etch techniques may be employed. Other techniques may also be employed to form ILD levels of the BEOL dielectric. The contacts may be tungsten or copper contacts while the metal lines may be copper lines. Other types of contacts and metal lines may also be useful. Additionally, a metal level may further include a seed layer lining the metal line in the metal level. For example, a seed layer is formed prior to forming the metal line of a metal level. The seed layer, for example, may be formed of Ta and TaN layers. Providing a seed layer formed of other materials may also be useful. Other types of BEOL dielectrics may also be included in the BEOL dielectric. The BEOL dielectric, for example, may include about five ILD levels. Providing a BEOL dielectric with other number of ILD levels may also be useful. The top ILD level may serve as a pad level 160 which includes pad contacts for external connections to the device.

A silicon nitride (SiN) 170 and a TEOS layer 172 may be formed over the wafer. For example, the SiN layer may be formed over the BEOL dielectric, and a TEOS layer may be formed over the SiN layer. For example, the SiN and TEOS layers may be protective layers covering the metal interconnects in the BEOL dielectric. Additionally, a passivation layer may be formed over the wafer (not shown). Alternatively, the passivation layer may be formed over the wafer at other stages of processing the wafer.

The process continues with processing the back side of the substrate. For example, the second major surface of the substrate is processed after processing of its first major surface. The second major surface of the substrate is exposed by performing a layer transfer process. The substrate 101, for example, may be bonded to another wafer 320 which serves as a carrier substrate. The wafer bonding may be performed in low temperature and is a high rate wafer bonding. Other techniques for exposing the back side of the substrate may also be useful. FIG. 4a shows the substrate 101 inverted after bonding to the carrier substrate with its first major surface facing the carrier substrate. For example, the active surface 105 of the substrate 101 faces the carrier substrate while the inactive surface or back side 107 of the substrate is exposed for processing. The carrier substrate, for example, may be silicate, or aluminum nitride wafer. Other types of carrier substrates may also be useful.

In one embodiment, the second major surface or back side of the substrate 101 is processed to form a fully depleted portion 210a and partially depleted portion 210b of the device, as illustrated in FIG. 4b. A mask and etch technique may be employed to thin the wafer. In one embodiment, a first etch process is performed on the second major surface of the semiconductor substrate to thin the wafer. For example, the semiconductor substrate is processed to reduce the thickness of the substrate. The etch process etches the semiconductor substrate material. For example, the first etch process etches the semiconductor substrate which is formed of homogenous material. The substrate may be etched to reduce its thickness for the fully depleted and partially depleted portions separately. For example, the first etch process includes localized etching of the substrate with different depths for the fully depleted and partially depleted portions.

In one embodiment, the localized etching employs separate etch masks. For example, a first etch mask of the first etch process may be employed to etch the substrate for the partially depleted portion, followed by removal of the first etch mask and deposition of a second etch mask of the first etch process to etch the substrate for the fully depleted portion. The first and second etch masks may both include a hard mask such as silicon nitride and a soft mask such as a photoresist. In one embodiment, the first etch process for thinning the wafer for the fully depleted and partially depleted portions includes wet etching. In another embodiment, the first etch process to thin the wafer for the fully depleted and partially depleted portions may be dry etching. Other thinning processes may also be used to thin the substrate.

As illustrated, the first etch process provides different substrate thicknesses for the fully depleted and partially depleted portions. For example, the substrate is etched for the fully depleted portion to expose a top surface of a transistor well. As for the partially depleted portion, the substrate may be etched without exposing the transistor well in the partially depleted portion. Etching the substrate to other depths may also be useful. For example, the thickness of a device can be adjusted during etching of the substrate depending on the electrical field to be sustained by the device. The second etch mask is removed after the first etch process.

The first etching process etches the semiconductor substrate in the device region to provide a second major surface of the semiconductor substrate having a stepped height. For example, the second major surface of the substrate is disposed on different planes for the fully depleted and partially depleted portions. For example, the second major surface of the substrate is disposed on first and second planes 207a and 207b for the fully depleted portion 210a and the partially depleted portion 210b respectively.

In one embodiment, the substrate is processed to improve the wafer thickness uniformity after the first etch process. In one embodiment, a second etch process is performed to improve the wafer thickness uniformity. For example, the second etch process further etches the semiconductor substrate material to improve the wafer thickness uniformity. For example, the second etch process etches the semiconductor substrate which is formed of the homogenous material. As described, the first major surface of the semiconductor wafer is processed without STI fabrication. This allows the wafer thickness uniformity improvement process on the back side of the substrate to be an etch of the bulk substrate with homogeneous material. For example, only silicon material is etched as the uniformity improvement is performed on the second major surface of the substrate.

An etch mask may be deposited on the wafer and patterned to expose the device region for the second etch process. The etch mask exposes the second major surface which is disposed on the different planes. The etch mask, for example, may include a hard mask and soft mask. The second etch process to improve the wafer thickness uniformity, in one embodiment, may be a gas cluster ion beam (GCIB) process. In another embodiment, the second etch process to improve the wafer thickness uniformity may be a selective etching. Providing other types of etch processes to improve the uniformity of the wafer thickness may also be useful. The etch mask is removed after the second etch process.

After the first and second etch processes, the substrate may have a first final substrate thickness in the fully depleted portion and a second final substrate thickness in the partially depleted portion. The first final substrate thickness, for example, may be of a few 100 Å (e.g., 800 Å and below). The second final substrate thickness, for example, may be of a few 100 Å (e.g., 800 Å and above).

The process continues with forming one or more device isolation structures in the substrate. For example, one or more STIs are formed in the substrate to isolate the circuit components such as the CMOS transistors. The process to form the device isolation structures includes forming isolation trenches corresponding to the device isolation structures to be formed in the substrate. The trenches may be formed by mask and etch techniques. In one embodiment, a hard mask, such as silicon oxide or silicon nitride, is used. The hard mask may be patterned by a photoresist layer which is exposed with an exposure source using a reticle with the desired pattern. The pattern on the resist mask is transferred to the hard mask by an etch, such as reactive ion etch (ME). Other types of etch processes may also be useful. The hard mask is then used to etch the substrate to form the isolation trenches.

Figure 4C:
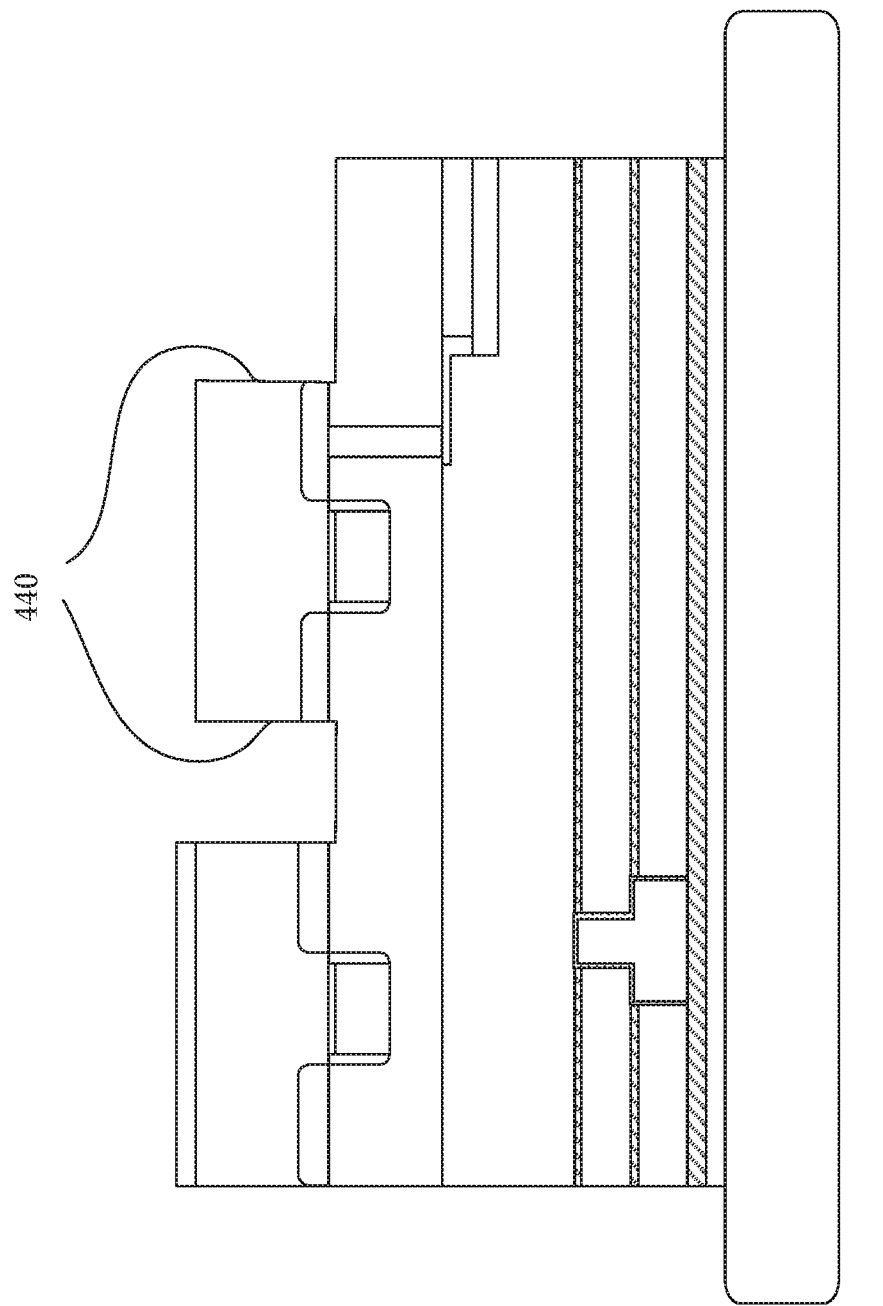

FIG. 4c illustrates isolation trenches 440 formed in the substrate. In one embodiment, the isolation trenches extend through the substrate from the second major surface to the first major surface of the substrate. In the case of device isolation trenches in the fully depleted portion of the substrate, the device isolation trenches extend from the second major surface on the first plane to the first major surface, while for device isolation trenches disposed in the partially depleted portion of the substrate, device isolation trenches extend from the second major surface on the second plane to the first major surface.

The isolation trenches may be formed to a same depth as the first and second final substrate thicknesses. For example, the isolation trenches in the fully depleted portion have the first final substrate thickness while isolation trenches in the partially depleted portion have the second final substrate thickness. Providing device isolation trenches with other depths may also be useful. The hard mask layer and photoresist is removed after forming the isolation trenches. Other techniques for forming the isolation trenches may also be useful.

The process continues with depositing a dielectric layer 450 over the second major surface of the substrate. As shown in FIG. 4d, the dielectric layer fills the isolation trenches. The dielectric layer filling the isolation trenches forms device isolation structures in the substrate. The dielectric layer may be an oxide layer such as silicon oxide. Providing other types of dielectric layers may also be useful. The dielectric layer is formed by, for example, chemical vapor deposition (CVD). Other techniques may also be useful to form the dielectric layer.

A polishing process such as chemical mechanical polishing (CMP) may be optionally performed after deposition of the dielectric layer. The polishing process may be performed depending on process requirements. For example, a CMP process may be performed in the case additional bonding is required for other device integration.

Figure 4E:
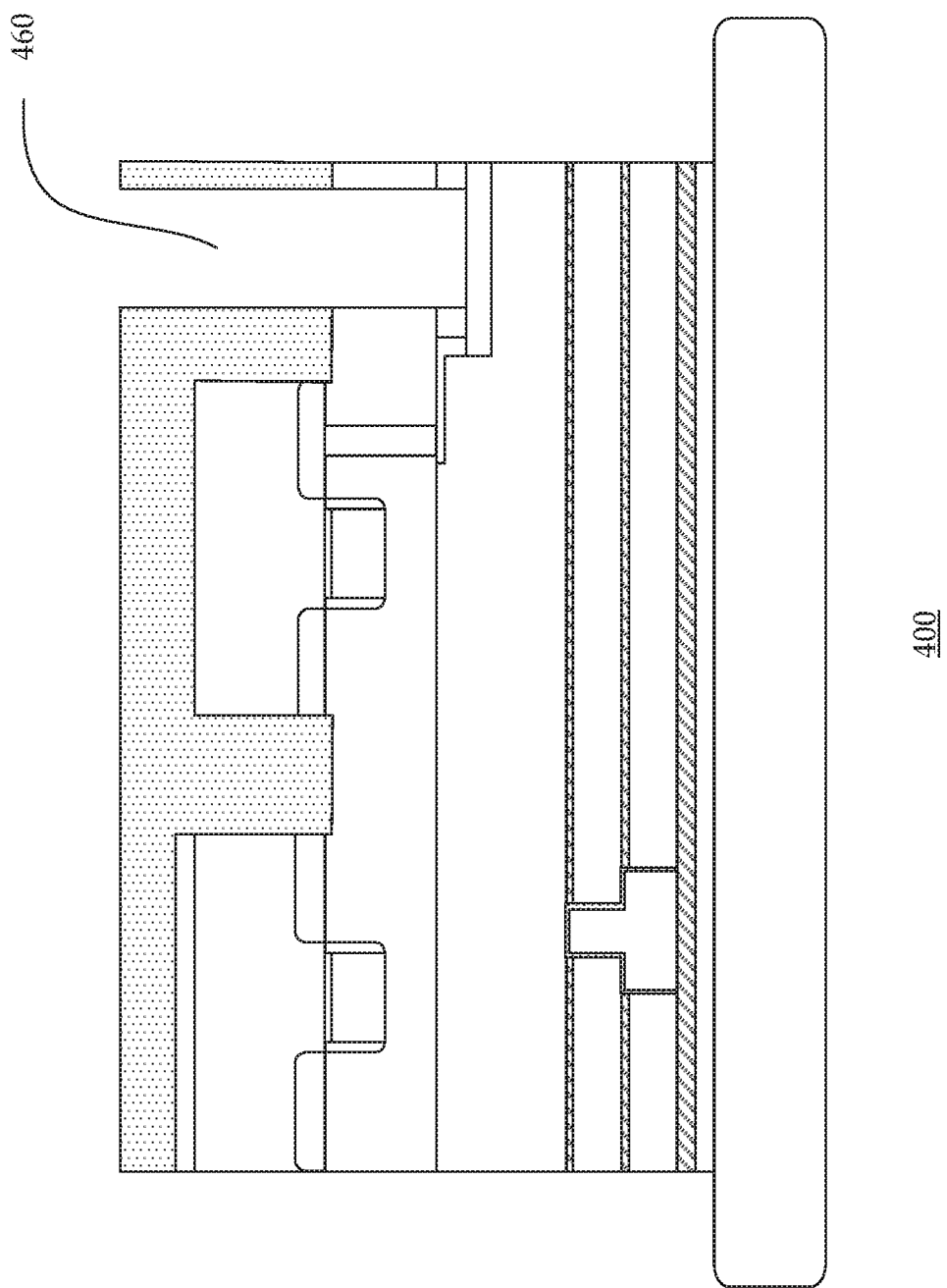

In one embodiment, a via contact may be formed through the substrate from the second major surface to contact a metal line in the BEOL dielectric. The via contact may extend from a top surface of the dielectric layer which is formed over the second major surface of the substrate and through the dielectric layer in the substrate to contact a metal line in the BEOL dielectric. Referring to FIG. 4e, a via opening 460 is formed through a device isolation structure in the substrate and extends into a portion of the BEOL dielectric to contact a metal level of the BEOL dielectric. The via opening may extend into a portion of the BEOL dielectric until it exposes a seed layer which lines the metal line. For example, the via opening may expose the second metal level. Providing the via opening which exposes other metal levels may also be useful.

The via opening may be formed using mask and etch techniques. For example, a RIE is performed using an etch mask to form the via opening. In one embodiment, the seed layer lining the metal line in a metal level of the BEOL dielectric to which the via contact is to contact may serve as an etch stop layer for forming the via opening. For example, Ta and TaN seed layers in a desired metal level to which the via contact connects serve as the etch stop layer for forming the via opening.

Referring to FIG. 4f, a conductive material, such as aluminum (Al), is deposited over the second major surface and fills the via opening, forming a via contact 465. Providing other types of conductive material such as copper may also be useful. A planarization process, such as CMP, may be performed to remove excess conductive material. As shown, the via contact which is formed from the back side of the substrate provides electrical connection from the second major surface of the substrate to a metal line in the BEOL dielectric on the first major surface. The carrier substrate may subsequently be removed. The wafer may proceed to packaging. Other processes may also be performed to complete the device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device, comprising:
   providing a semiconductor substrate with first and second major surfaces, the first major surface includes circuit components formed thereon and a back-end-of-line (BEOL) dielectric layer disposed over the first major surface of the semiconductor substrate;
   performing a single layer transfer to expose the second major surface of the semiconductor substrate for processing;
   performing wafer thinning of the semiconductor substrate using a first etch process on the second major surface of the semiconductor substrate;
   forming a via contact through a device isolation structure in the semiconductor substrate which extends from the second major surface to a metal level in the BEOL dielectric layer; and
   forming one or more device isolation structures that extend through the semiconductor substrate from the second major surface of the semiconductor substrate.

2. The method of claim 1 wherein the semiconductor substrate is a bulk substrate with a homogeneous crystalline material.

3. The method of claim 2 wherein forming the one or more device isolation structures comprises: removing homogenous material of the semiconductor substrate to form one or more isolation trenches; and depositing dielectric material over the semiconductor substrate to fill the one or more isolation trenches.

4. The method of claim 3 wherein forming the via contact comprises:
etching a via opening through the dielectric material in the device isolation structure; and filling the via opening with contact material.

5. The method of claim 4 further comprising: a seed layer lining a metal line in the metal level, wherein the seed layer serves as an etch stop layer for forming the via opening.

6. The method of claim 5 wherein the seed layer comprises TaN and Ta seed layers.

7. The method of claim 1 wherein the first etch process etches the semiconductor substrate to form a substantially planar second major surface for a partially depleted device.

8. The method of claim 1 wherein the first etch process etches the semiconductor substrate to form a substantially planar second major surface for a fully depleted device.

9. The method of claim 1 wherein the first etch process comprises wet etching or dry etching.

10. The method of claim 1 wherein the single layer transfer bonds the semiconductor substrate to another carrier substrate.

11. The method of claim 1 wherein the semiconductor substrate comprises a homogeneous crystalline material.

12. The method of claim 1 further comprising:
performing a second etch process on the second major surface of the semiconductor substrate, after the first etch process, to improve wafer thickness uniformity.

13. The method of claim 12 wherein the second etch process to improve the wafer thickness uniformity comprises gas cluster ion beam.

14. The method of claim 12 wherein the second etch process to improve the wafer thickness uniformity comprises selective etching.

15. A method for forming a device, comprising:
providing a semiconductor substrate with first and second major surfaces, the first major surface includes circuit components formed thereon and a back-end-of-line (BEOL) dielectric layer disposed over the first major surface of the semiconductor substrate;
performing a single layer transfer to expose the second major surface of the semiconductor substrate for processing;
performing wafer thinning of the semiconductor substrate using a first etch process on the second major surface of the semiconductor substrate; and
forming one or more device isolation structures that extend through the semiconductor substrate from the second major surface of the semiconductor substrate,
wherein the first etch process further comprises a localized etch using separate etch masks such that the second major surface of the semiconductor substrate is disposed on different planes for partially depleted and fully depleted portions of the device.

* * * * *